United States Patent [19]
Higashi et al.

[11] Patent Number: 4,735,908
[45] Date of Patent: Apr. 5, 1988

[54] PROCESS FOR FABRICATING SOLID-STATE IMAGING DEVICE

[75] Inventors: Akio Higashi; Haruji Shinada; Kazuhiro Kawajiri; Yoshihiro Ono; Mitsuo Saitou; Hiroshi Tamura; Mitsuru Ikeda, all of Kaisei, Japan

[73] Assignee: Fuji Photo Film Co., Ltd., Kanagawa, Japan

[21] Appl. No.: 77,157

[22] Filed: Jul. 24, 1987

Related U.S. Application Data

[62] Division of Ser. No. 790,015, Oct. 22, 1985, Pat. No. 4,694,317.

[30] Foreign Application Priority Data

Oct. 22, 1984 [JP] Japan ................... 59-220547
Dec. 7, 1984 [JP] Japan ................... 59-257686

[51] Int. Cl.4 ........................................ H01L 21/283
[52] U.S. Cl. .......................................... 437/2; 437/3; 437/53; 437/181; 437/189
[58] Field of Search .................. 437/2, 3, 53, 181, 189

[56] References Cited

U.S. PATENT DOCUMENTS 4,236,829 12/1980 Chikamura et al. ............ 357/31
4,447,291 5/1984 Schulte ............................ 357/30
4,507,519 3/1985 Kazumi et al. .................. 357/30
4,532,536 7/1985 Hatanaka et al. ............... 357/84
4,542,578 9/1985 Yamano et al. ................. 437/2
4,582,721 4/1986 Yoshino et al. ................. 437/2

Primary Examiner—George T. Ozaki
Attorney, Agent, or Firm—Sughrue, Mion, Zinn, Macpeak and Seas

[57] ABSTRACT

A solid-state imaging device having a scanning circuit and a photoconductive film formed in layers on a semiconductor substrate, and a process for forming the same, wherein high resolution with substantially no color mixing is attained. An electrode layer is formed over the semiconductor substrate for providing the plural electrodes, and a photoconductive film is formed over the electrode layer. A first transparent electrode is produced over the photoconductive film, after which a resist pattern is formed on the first transparent electrode layer corresponding to the pixels. The first transparent layer and the photoconductive film are etched according to the resist pattern to spatially isolate adjacent pixels in the first transparent layer and the photoconductive film. Adjacent pixels are isolated by etching, using the resist pattern, that part of the electrode layer on which are disposed the first transparent electrode layer and the photoconductive film between isolated pixels.

5 Claims, 3 Drawing Sheets

PROCESS FOR FABRICATING SOLID-STATE IMAGING DEVICE

This application is a division of application Ser. No. 790,015 filed Oct. 22, 1985, now U.S. Pat. No. 4,694,377.

BACKGROUND OF THE INVENTION

The present invention relates to a process for fabricating a solid-state imaging device having a scanning circuit and a photoconductive film formed in layers on a semiconductor substrate.

In order to provide enhanced light sensitivity, a solid-state imaging device of the type contemplated by the present invention is provided with an amorphous silicon film formed on a substrate for a scanning circuit of either the MOS, CCD or BBD type. The device may include a semiconductor substrate having arranged thereon, in the stated order, a scanning circuit for scanning plural pixels, a photoconductive film, and a transparent electrode layer.

One problem with this device is that defects such as voids or cracks can easily develop in those areas of the amorphous silicon layer which correspond to step portions such as the edges of an electrode on the substrate for a scanning circuit and contact holes. The areas of the photoconductive layer containing these defects have a tendency to be etched faster than the other areas during patterning for providing a separate isolation region in the photoconductive layer between pixels. In addition, a leakage current can flow in such defective areas to cause considerable deterioration of the characteristics of the device.

Another problem with the solid-state imaging device using amorphous silicon as a photoconductive material is that the sheet resistivity of amorphous silicon is slightly lower than that of the other materials, which causes a significant reduction in resolution and increases the chance of color mixing. This problem could be eliminated by increasing the sheet resistivity of the amorphous silicon film, but then the carrier mobility is decreased or the trap density is increased, producing an after-image of greater intensity.

Another approach is to isolate the pixels in the photoconductive layer, but during etching procedures for providing a separate isolation region or making holes in an interlevel insulating layer, undesired areas of the photoconductive layer may be etched, resulting in an increased chance of shorting.

A further problem arises from the relatively large thickness (0.5 to 5 microns) of each pixel in the photoconductive layer; that is, the conductivity of a transparent electrode layer covering the photoconductive layer may be interrupted at step portions in the latter.

SUMMARY OF THE INVENTION

The principal object, therefore, of the present invention is to provide a process for fabricating a solid-state imaging device that has high resolution and causes no color mixing.

In order to attain this object, the process of the present invention ensures reliable isolation of pixels in an amorphous silicon film by performing processing steps in a simple but proper manner so as to avoid the occurrence of defects such as cracks and voids.

More particularly, in accordance with one aspect of the present invention, a process is provided for fabricating a solid-state imaging device that comprises a semiconductor substrate having arranged thereon, in the stated order, a circuit for scanning a plurality of pixels, a photoconductive film and a transparent electrode layer, said plurality of pixels being defined by a plurality of electrodes on said semiconductor substrate and said transparent electrode layer, wherein said process includes a step of forming an electrode layer over said semiconductor substrate for providing said plurality of electrodes, a step of forming said photoconductive film over said electrode layer, a step of forming a first transparent electrode layer over said photoconductive film, a step of forming a resist pattern on said first transparent electrode layer that corresponds to said plurality of pixels, a step of etching said first transparent electrode layer and said photoconductive film according to said resist pattern so as to spatially isolate adjacent pixels in said first transparent electrode layer and said photoconductive film, and a step of isolating adjacent pixels in said electrode layer by etching, according to said resist pattern, that part of said electrode layer on which are disposed said first transparent electrode layer and said photoconductive film between isolated pixels.

In accordance with another aspect of the invention, a process is provided for fabricating a solid-state imaging device that comprises a semiconductor substrate having arranged thereon, in the stated order, a circuit for scanning a plurality of pixels, a photoconductive film and a transparent electrode layer, said plurality of pixels being defined by a plurality of electrodes on said semiconductor substrate and said transparent electrode layer, wherein said process includes a step of forming an electrode layer over said semiconductor substrate for providing said plurality of electrodes, a step of forming said photoconductive film over said electrode layer, a step of forming a first transparent electrode layer over said photoconductive layer, a step of forming a resist pattern on said first transparent electrode layer that corresponds to said plurality of pixels, a step of etching said first transparent electrode layer and said photoconductive film according to said resist pattern so as to spatially isolate adjacent pixels in said first transparent electrode layer and said photoconductive film, a step of isolating pixels in said electrode layer by etching, according to said resist pattern, that part of said electrode layer on which are disposed said first transparent electrode layer and said photoconductive film between isolated pixels, a step of covering the space between isolated pixels with a passivation film, a step of depositing a second transparent electrode layer over said first transparent electrode layer and said passivation film, and a step of providing a light-shielding layer in that area of said second transparent electrode layer which corresponds to the space between adjacent isolated pixels.

Still further, in order to attain the above-mentioned object, the device of the present invention ensures reliable isolation of pixels in an amorphous silicon film by providing adequate protection of the photoconductive layer from etching procedures without causing defects such as conduction interruption at step portions or the occurrence of cracks and voids.

Therefore, in accordance with another aspect of the present invention, a solid-state imaging device is provided that comprises a semiconductor substrate having arranged thereon, in the stated order, a circuit for scanning a plurality of pixels, a light-sensitive film and a transparent electrode layer, said plurality of pixels being defined by a plurality of electrodes on said semiconductor substrate and said transparent electrode layer, wherein said light-sensitive layer is separated for individual pixels, a first transparent electrode layer being disposed on the light-sensitive layer corresponding to each pixel, an interlevel insulation film is disposed in each of the grooves that isolate adjacent pixels and on the periphery of the light-sensitive layer separated for individual pixels, a second transparent electrode is disposed over said first transparent electrode layer and said interlevel insulation film, and a light-shielding metal layer is disposed in that area of said second transparent electrode layer which corresponds to the isolation between adjacent pixels.

In accordance with still another aspect of the present invention, a process is provided for fabricating a solid-state imaging device that comprises a semiconductor substrate having arranged thereon, in the stated order, a circuit for scanning a plurality of pixels, a photoconductive film and a transparent electrode layer, said plurality of pixels being defined by a plurality of electrodes on said semiconductor substrate and said transparent electrode layer, wherein said process includes a step of forming a first electrode layer over said semiconductor substrate for providing said plurality of electrodes, a step of forming a photoconductive film over said electrode layer, a photolithographic step for separating said electrode layer, said photoconductive film and said first transparent electrode layer to provide regions corresponding to said plurality of pixels, a step of depositing an interlevel insulation film over the separated first transparent electrode layer and the isolation region between adjacent pixels, a photolithographic step for making holes in selected areas of said interlevel insulation film that correspond to said plurality of pixels, a step of forming a second transparent electrode layer over said interlevel insulation film with holes and that portion of the first transparent electrode layer which is exposed in said holes, and a step of forming a light-shielding metal layer in that area of said second transparent electrode layer which corresponds to the isolation region between adjacent pixels.

PREFERRED EMBODIMENTS OF THE INVENTION

Figure 1A:
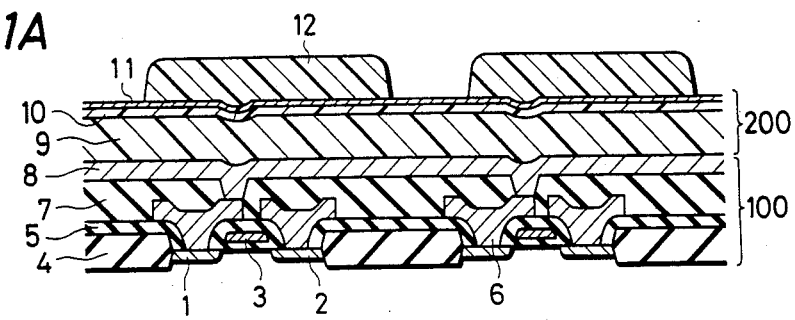
FIGS. 1A to 1D are sectional views illustrating a sequence of steps for fabricating a solid-state imaging device by a process of the present invention.

FIGS. 1A to 1D show a sequence of steps that may be used to fabricate a solid-state imaging device in accordance with a first embodiment of the present invention. In these Figures, 100 denotes a substrate of a scanning circuit, and 200 indicates a photoconductive film unit. The substrate for the scanning circuit 100 may assume any known configuration and may have formed therein, for example, MOS, CCD or BBD devices. The following description assumes that the substrate 100 employs MOS devices.

As shown, the substrate 100 has a plurality of MOS field-effect transistors, each composed of a source 1, a drain 2 and a gate 3. Adjacent MOS field-effect transistors are isolated by an $SiO_2$ insulator layer 4. The gate is buried within an insulator layer 5 made of phosphosilicate glass (PSG) or $SiO_2$. An electrode 6 is connected to the source 1 and is covered with an insulator layer 7 made of PSG, $SiO_2$, $Si_3N_4$ or an organic material such as polyimide. The electrode 6 is overlaid with a uniform thickness of an electrode layer 8 that is connected to the source 1 and which will define a plurality of pixels by a step which will be described later. The electrode layer 8 may be made of Al-Si, Al-Si-Cu or a transition metal such as Mo.

The electrode layer 8 provides a substrate for the photoconductive film unit 200, which is formed by the following procedure: First, an undoped, n-type amorphous silicon film or a boron-doped, high-resistance, i-type amorphous silicon film 9 is disposed on the substrate electrode 8. On this n-type (or i-type) amorphous silicon film is formed an impurity-doped p+ type amorphous silicon film 10. The film 10 is further overlaid with a first transparent electrode layer 11 made of, for example, ITO.

Figure 1B:
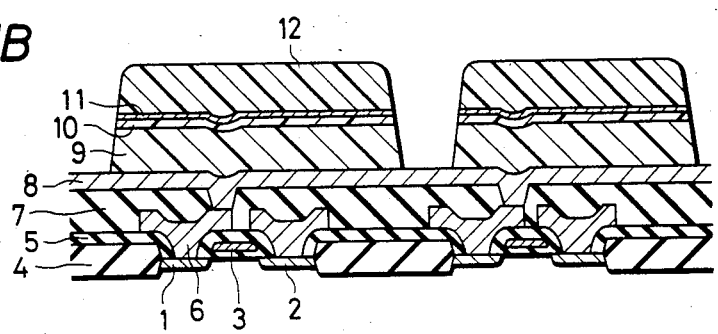
Figure 1C:
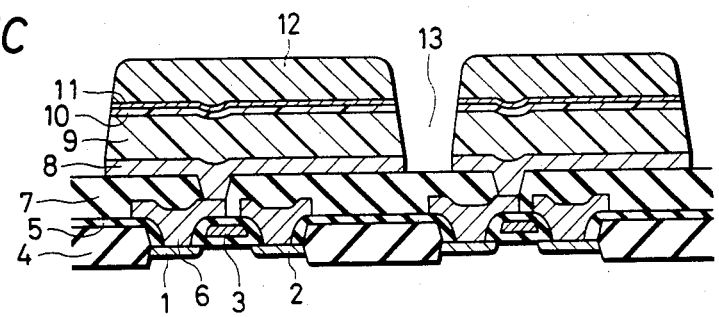

Then, as shown in FIG. 1A, the transparent electrode layer 11 is overlaid with a resist pattern 12 in the areas where pixels are to be formed. According to this resist pattern, the photoconductive film unit 200 is first etched to provide discrete pixels, as shown in FIG. 1B. Using the same resist pattern, the substrate electrode 8 is then etched to provide grooves 13 that isolate adjacent pixels in the electrode 8, as shown in FIG. 1C. In the process of the present invention, the same etching mask is used to isolate pixels not only in the photoconductive film unit 200, but also in the substrate electrode 8. Compared with the conventional process that requires the formation of two resist patterns and their removal by etching, the present invention achieves the same result in a more efficient manner. An attendant advantage with this process is self-alignment, which eliminates the possibility of misalignment that may occur if two resist patterns are used.

Figure 1D:
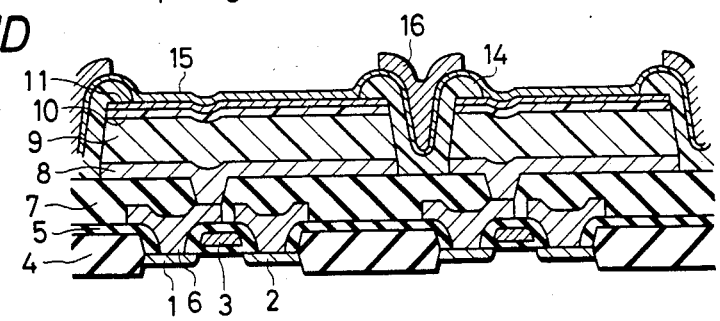

Subsequently, as shown in FIG. 1D, an inorganic material such as $Si_3N_4$ or $SiO_2$, or an organic material such as polyimide, is deposited in each of the grooves 13 by a plasma-assisted CVD process or other suitable technique to provide a groove-isolating passivation film 14. A second transparent electrode layer 15 is then deposited to cover the entire surface of the transparent electrode layer 11 and the passivation film 14. A metallic light-shielding layer 16 is coated on those areas of the second transparent electrode layer 15 which correspond to the pixel isolation regions.

Figure 2:
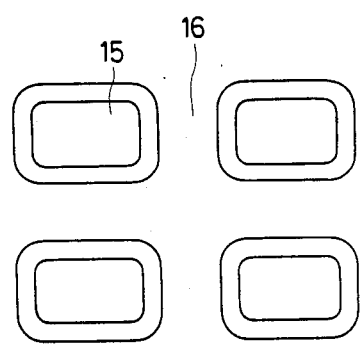
FIG. 2 is plan view showing the surface of the solid-state imaging device fabricated by the process of FIGS. 1A to 1D.

The solid-state imaging device fabricated by the above-described procedure has a surface as shown in FIG. 2.

In the embodiment illustrated above, the photoconductive film unit 200 has the second transparent electrode layer 15 on top, under which lie, in the stated order, the first transparent electrode layer 11, the p+ type amorphous silicon film 10, and the n-type (or i-type) amorphous silicon film 9. In other embodiments, a p− type amorphous silicon film may be disposed between the substrate electrode 8 and the n-type (or i-type) amorphous silicon film 9, or the transparent electrode layers may be omitted.

As will be apparent from the foregoing description, the solid-state imaging device fabricated by the process of the present invention features complete isolation of pixels, which provides for satisfactory protection against loss of resolution and the occurrence of color mixing. In addition, because the separation of pixels is performed after an amorphous silicon film is deposited on the substrate electrode with a uniform thickness, there is no chance for defects such as voids and cracks to form in areas where steps are formed at edges of the substrate electrode as in the conventional product. The process of the present invention accomplishes the isolation of pixels both in the amorphous silicon film and in the substrate electrode using one resist mask, and the resulting self-alignment not only eliminates the chance of misalignment that may occur if two masks are used, but also provides for a greater processing efficiency.

The solid-state imaging device fabricated by the present invention permits the use of a film composition that exhibits a relatively low sheet resistivity without reducing the carrier mobility or increasing the trap density. This feature contributes to the provision of characteristics wherein the spectral sensitivity for the shorter wavelength band is held high and the occurrence of an after-image is minimized. As a further advantage, the light-shielding layer made of a metal film provides good coverage over steps in the transparent electrode layers, and thereby further improves the reliability of the device.

FIGS. 3A to 3D show a sequence of steps that may be used to fabricate a solid-state imaging device by a process of a second embodiment the present invention. In these Figure, 300 denotes a substrate for the scanning circuit, and 400 indicates a photoconductive film unit. The substrate for the scanning circuit 300 may assume any known configuration and may be implemented as described above, using MOS, CCD or BBD devices. The following description assumes that the substrate 300 is implemented with MOS devices.

As shown, the substrate 300 has formed therein a plurality of MOS field-effect transistors, each composed of a source 21, a drain 22 and a gate 23. Adjacent MOS field-effect transistors are isolated by an $SiO_2$ insulator layer 24. The gate 23 is buried within an insulator layer 25 made of phosphosilicate glass (PSG) or $SiO_2$. An electrode 26 is connected to the source 21 and is covered with an insulator layer 27 made of PSG, $SiO_2$, $Si_3N_4$ or an organic material such as polyimide. The electrode 26 is overlaid with a uniform thickness of an electrode layer 28 that is connected to the source 21 and which will define a plurality of pixels by a step which will be described later. The electrode layer 28 may be made of Al-Si, Al-Si-Cu or a transition metal such as Mo.

The electrode layer 28 provides a substrate for the photoconductive film unit 400, which is formed by the following procedure: First, an undoped, n-type amorphous silicon film or a boron-doped, high-resistance, i-type amorphous silicon film 29 is disposed on the substrate electrode 28, and on this n-type (or i-type) amorphous silicon film is formed an impurity-doped $p_+$ type amorphous silicon film 30, which is further overlaid with a first transparent electrode layer 31 made of, for example, ITO, $SnO_2$, $In_2O_3$, $CdO_2$ or $CrSi_x$ with a thickness of about 100 to 1,000 Å.

In the next step, the transparent electrode layer 31 is overlaid with a resist pattern 32 in the areas where pixels are to be formed. The resist pattern 32 is indicated by the dashed line in FIG. 3A. Etching is then performed to provide grooves 33 that isolate adjacent pixels in the photoconductive film unit 400, as shown in FIG. 3B.

Figure 3A:
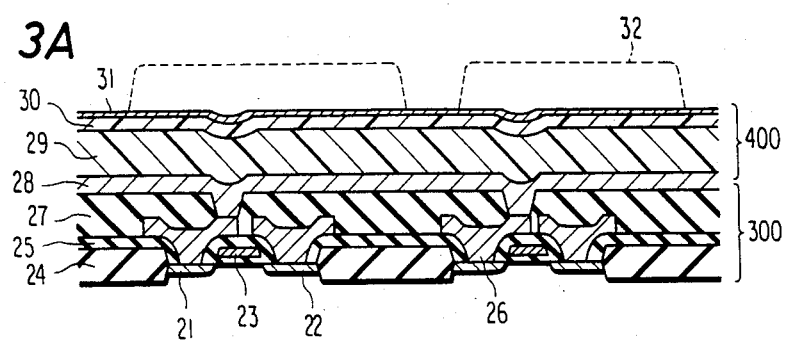
FIGS. 3A to 3D are sectional views showing a sequence of steps for fabricating a solid-state imaging device by another process of the present invention.
Figure 3B:
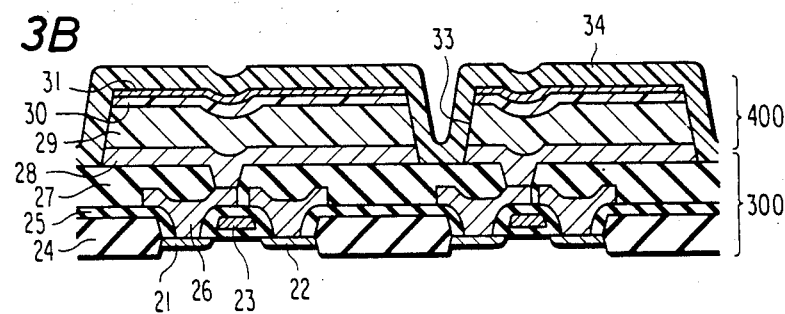

Then, as shown in FIG. 3B, an inorganic material such as $Si_3N_4$, $SiO_2$ or SPG or an organic material such as polyimide is deposited in each of the grooves 33 by a plasma-assisted CVD process or other suitable technique to provide an interval insulation film 34.

Figure 3C:
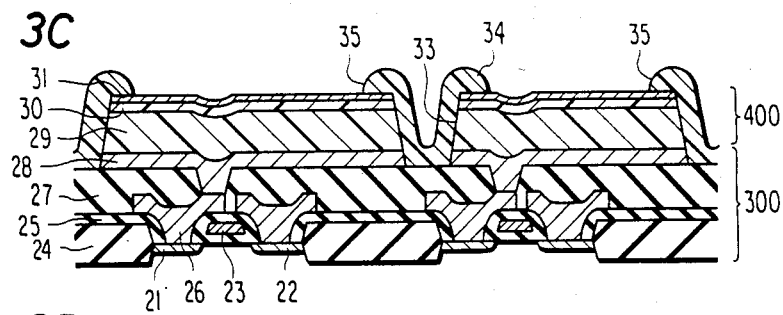

The interlevel insulation film 34 is selectively etched in areas corresponding to the pixels to make contact holes 35, as shown in FIG. 3C.

Figure 3D:
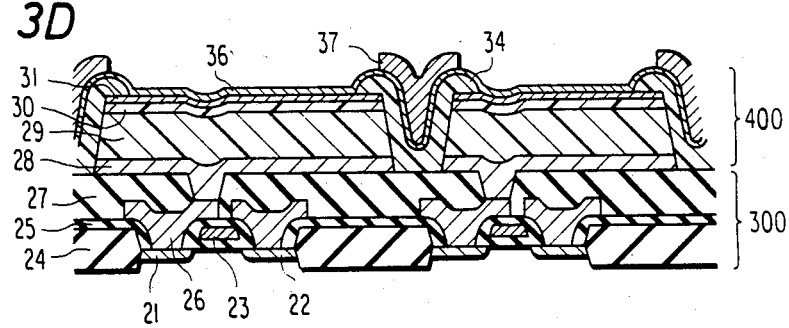

Then, as shown in FIG. 3D, a second transparent electrode layer 36 is deposited to cover the entire surface of the first transparent electrode layer 31 and the interlevel insulation film 34 with the holes 35. The thickness of the second transparent electrode layer ranges from about 500 to 3,000 Å. It may be made of the same material as used to provide the first transparent electrode layer 11. A metallic, light-shielding layer 37 is coated on those areas of the second transparent electrode layer 36 which correspond to the pixel isolation regions. The layer 37 may be made of a metal such as Al, Al-Si, Al-Si-Cu, or a transition metal such as Mo, W, Cr or Ta.

In the embodiment illustrated above, the photoconductive film unit 400 has the second transparent electrode layer 36 on top, under which lie, in the stated order, the first transparent electrode layer 31, the $p+$ type amorphous silicon film 30, and the n-type (or i-type) amorphous silicon film 29. In other embodiments, a $p^-$ type amorphous silicon film may be disposed between the substrate electrode 28 and the n-type (or i-type) amorphous silicon film 29.

As will be apparent from the foregoing description, the solid-state imaging device of this embodiment the present invention features complete isolation of pixels, which provides for satisfactory protection against loss of resolution and the occurrence of color mixing. Because of a great difference in selectivity for etching between the $p+$ type amorphous silicon film forming the light-sensitive layer and the overlying protective, transparent electrode layer (for instance, an ITO layer), the $p+$ type amorphous silicon film is protected by the overlying transparent electrode layer during the formation of contact holes in the interlevel insulation film by an etching process (for instance, plasma etching), and only the desired areas of the amorphous silicon film are etched. In addition, because the transparent electrode layer contacts the $p+$ amorphous silicon film over a larger area than the holes formed above that layer, an electric field can be effectively applied across the photoconductive layer without reducing the sheet resistivity of the $p+$ type amorphous silicon film, which contributes to the provision of improved resolution. Furthermore, such a transparent electrode layer can be formed by a very simple step.

Further, the solid-state imaging device fabricated by the process of the present invention permits the use of a film composition that exhibits a relatively low sheet resistivity without reducing the carrier mobility or increasing the trap density. This feature contributes to the provision of characteristics wherein the spectral sensitivity for the shorter wavelength band is held high and the occurrence of an after image is minimized. As a further advantage, since the light-shielding layer is made of a metal, even if the transparent electrode layer that is formed after the isolation of pixels in the photoconductive film unit does not extend deeply into the isolating grooves, this metal layer ensures the necessary conductivity and renders the device insensitive to any adverse effects that may be caused by conduction interruption of the transparent electrode layer at step portions.

We claim:

1. A process for fabricating a solid-state imaging device that comprises a semiconductor substrate having arranged thereon, in the stated order, a circuit for scanning a plurality of pixels, a photoconductive film and a transparent electrode layer, said plurality of pixels being defined by a plurality of electrodes on said semiconductor substrate and said transparent electrode layer, said process comprising the steps of:

forming an electrode layer over said semiconductor substrate for providing said plurality of electrodes;

forming said photoconductive film over said electrode layer;

forming a first transparent electrode layer over said photoconductive film;

forming a resist pattern on said first transparent electrode layer that corresponds to said plurality of pixels;

etching said first transparent electrode layer and said photoconductive film according to said resist pattern so as to spatially isolate adjacent pixels in said first transparent electrode layer and said photoconductive film; and isolating adjacent pixels in said electrode layer by etching, according to said resist pattern, that part of said electrode layer on which are disposed said first transparent electrode layer and said photoconductive film between isolated pixels.

2. A process for fabricating a solid-state imaging device that comprises a semiconductor substrate having arranged thereon, in the stated order, a circuit for scanning a plurality of pixels, a photoconductive film and a transparent electrode layer, said plurality of pixels being defined by a plurality of electrodes on said semiconductor substrate and said transparent electrode layer, said process comprising the steps of:

forming an electrode layer over said semiconductor substrate for providing said plurality of electrodes;

forming said photoconductive film over said electrode layer;

forming a first transparent electrode layer over said photoconductive film;

forming a resist pattern on said first transparent electrode layer that corresponds to said plurality of pixels;

etching said first transparent electrode layer and said photoconductive film according to said resist pattern so as to spatially isolate adjacent pixels in said first transparent electrode layer and said photoconductive film;

isolating adjacent pixels in said electrode layer by etching, according to said resist pattern, that part of said electrode layer on which are disposed said first transparent electrode layer and said photoconductive film between isolated pixels;

covering a space between adjacent isolated pixels with a passivation film;

depositing a second transparent electrode layer over said first transparent electrode layer and said passivation film; and providing a light-shielding layer in that area of said second transparent electrode layer which corresponds to spaces between adjacent isolated pixels.

3. The process according to claim 1 or 2, wherein said photoconductive film comprises a $p^+$ type amorphous silicon film and an n- or i-type amorphous silicon film arranged in a superposed relationship so that said $p^+$ type amorphous silicon film is located closer to a surface on which incident light falls.

4. The process according to claim 1 or 2, wherein said photoconductive film comprises a $p^+$ type amorphous silicon film, an n- or i-type amorphous silicon film and a $p^-$ type amorphous silicon film arranged in a superposed relationship so that said $p^+$ type amorphous silicon film is located closest to a surface on which incident light falls, whereas said $p^-$ type amorphous silicon film is located farthest from such surface.

5. A process for fabricating a solid-state imaging device that comprises a semiconductor substrate having arranged thereon, in the stated order, a circuit for scanning a plurality of pixels, a photoconductive film and a transparent electrode layer, said plurality of pixels being defined by a plurality of electrodes on said semiconductor substrate and said transparent electrode layer, said process comprising the steps of:

forming an electrode layer over said semiconductor substrate for providing said plurality of electrodes;

forming a photoconductive film over said electrode layer;

forming a first transparent electrode layer over said photoconductive film;

photolithographically separating said electrode layer, said photoconductive film and said first transparent electrode layer to provide regions corresponding to said plurality of pixels;

depositing an interlevel insulation film over the separated first transparent electrode layer and isolation regions between adjacent pixels;

photolithographically forming holes in selected areas of said interlevel insulation film that correspond to said plurality of pixels;

forming a second transparent electrode layer over said interlevel insulation film with holes and that portion of said first transparent electrode layer which is exposed in said holes; and forming a light-shielding metal layer in that area of said second transparent electrode layer which corresponds to isolation regions between adjacent pixels.

* * * * *